United States Patent
Cha et al.

(10) Patent No.: US 7,603,596 B2
(45) Date of Patent: *Oct. 13, 2009

(54) MEMORY DEVICE CAPABLE OF DETECTING ITS FAILURE

(75) Inventors: Jae Hoon Cha, Kyoungki-do (KR); Geun Il Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/843,969

(22) Filed: Aug. 23, 2007

(65) Prior Publication Data
US 2007/0285995 A1   Dec. 13, 2007

Related U.S. Application Data

(63) Continuation of application No. 11/122,714, filed on May 5, 2005, now Pat. No. 7,376,889.

(30) Foreign Application Priority Data
Nov. 15, 2004   (KR) ...................... 10-2004-0093121

(51) Int. Cl.
*G11C 29/00* (2006.01)
(52) U.S. Cl. ........................... 714/718; 714/25; 714/30; 714/42; 714/48; 714/703; 714/709; 714/715; 714/719; 714/720; 714/733; 714/735; 714/798; 714/799; 714/818; 714/819; 714/824; 365/201

(58) Field of Classification Search ...................... None
See application file for complete search history.

(56) References Cited

U.S. PATENT DOCUMENTS

| | | | | |
|---|---|---|---|---|
| 6,163,863 A * | 12/2000 | Schicht | ........................ | 714/718 |
| 6,182,254 B1 * | 1/2001 | Bae | .............................. | 714/718 |
| 6,301,171 B2 * | 10/2001 | Kim et al. | .............. | 365/189.02 |
| 6,311,299 B1 * | 10/2001 | Bunker | ........................ | 714/719 |
| 6,519,726 B1 * | 2/2003 | Shibata | ........................ | 714/718 |
| 7,013,413 B1 * | 3/2006 | Kim et al. | .................... | 714/719 |
| 7,047,461 B2 * | 5/2006 | Yamazaki et al. | ........... | 714/719 |
| 7,228,477 B2 * | 6/2007 | Thalmann | .................... | 714/735 |
| 7,325,173 B2 * | 1/2008 | Kikutake et al. | ............ | 714/703 |
| 2006/0092681 A1 * | 5/2006 | Kawakubo | .................... | 365/52 |

* cited by examiner

*Primary Examiner*—John P Trimmings
(74) *Attorney, Agent, or Firm*—Ladas & Parry LLP

(57) ABSTRACT

A memory device capable of detecting its failure, the memory device includes a data input section for receiving data applied from an external part of the memory device; a latch section for receiving and storing therein the data which have passed through the data input section; memory cell arrays for storing therein the data which have passed through the data input section; and a data compressor for determining whether or not the data stored in the latch section and the data stored in the memory cell arrays are identical to each other.

9 Claims, 8 Drawing Sheets

MEMORY DEVICE CAPABLE OF DETECTING ITS FAILURE

BACKGROUND OF THE INVENTION

1. Field of the Invention

The present invention relates to a memory device, and more particularly to a memory device capable of detecting its failures, using a data compressor.

2. Description of the Prior Art

As generally known in the art, there are various kinds of conventional methods for testing whether or not a failure occurs in a memory device. One of the conventional testing methods includes, for example, steps of recording data in memory cell arrays by a writing operation, then reading the data stored in the memory cell arrays by a reading operation, and detecting whether or not the written data and the read data are identical.

FIG. 1 illustrates a testing method for detecting whether or not a failure occurs in the conventional memory device. Hereinafter, the memory device described in the specification will be regarded as DDR SDRAM groups (DDRI, DDRII, DDRIII, . . . , ).

Referring to FIG. 1, data Din <0:15> are applied to a data input section 101 in synchronizing with an external clock clk. In this stage, if a write command becomes active, the data Din <0:15> are sent to a write driving section 102 through a global input/output line. As known in the art, in the conventional memory device of the DDR SDRAM group, the data applied to the write driving section 102 can be classified generally into two kinds of data, that is, even data gio_e<0:15> and odd data gio_o<0:15>. Data lin_e<0:15> and lin_o<0:15> output from the write driving section 102 are applied to a memory cell arrays 103 through a local data line.

Next, if a read command becomes active, the data stored in the memory cell arrays 103 are sent to an input/output sense amplifier 104 through the local data line. Data tgo_e<0:15> and tgo_o<0:15> amplified in the input/output sense amplifier 104 are applied to a data compressor 105 through the global line.

The data compressor 105 compresses 16-bit data into 4-bit data, and then again compresses the compressed 4-bit data into 1-bit data. For example, if the read data tgo_e<15>, tgo_e<14>, tgo_e<13> and tgo_e<12> are all the same as original written data, the read data are compressed into a 1-bit high level data D3. If the read data tgo_e<>15>, tgo_e<14>, tgo_e<13> and tgo_e<12> are not the same as the original written data, the read data are compressed into a 1-bit data D3 of low level. Therefore, if the compressed data D3 is at low level, this means the compressed data D3 indicate themselves as failure.

Similar to this, the data tgo_e<11>, tgo_e<10>, tgo_e<9> and tgo_e<8> are compressed into 1-bit data D2, the data tgo_e<7>, tgo_e<6>, tgo_e<5> and tgo_e<4> are compressed into 1-bit data D1, and the data tgo_e<3>, tgo_e<2>, tgo_e<1> and tgo_e<0> are also compressed into 1-bit data D0. Also like the above cases, if the data D2, D1 and D0 are at high levels, this means the failures of the data did not occur, whereas if the data D2, D1 and D0 are at low levels, this means the failures thereof occurred.

Next, 4-bit data D3, D2, D1 and D0 are also compressed into 1-bit data. In this case, if the 4-bit data D3, D2, D1 and D0 are all at high levels, the corresponding compressed 1-bit data become all the high levels accordingly, whereas if at least one of the 4-bit data D3, D2, D1 and D0 is at low level, the compressed 1-bit data become low levels so that the failure of the memory can be detected.

As mentioned above, the data compressor 105 compresses the 16-bit data into the 1-bit data tgo_e<0> and tgo_o<0> to send the compressed 1-bit data to a data output section 106. Then the data stored in the data output section 106 are output to an external part of the memory deice in synchronizing with clocks generated in for example, a DDL circuit (not shown).

In the prior art, however, there are some problems as followings.

For example, if the read data tgo_e<15>, tgo_e<14>, tgo_e<13> and tgo_e<12> are not the same as the original written data, the read data should be compressed into the low level data D3. However, when all of the original written data are high level data and all of the read data are low level data, the compressed data should output the high level signals, which makes it impossible to detect the failure of the memory device. This is because there are not means for determining whether or not the original written data and the data applied by the compressor are identical.

SUMMARY OF THE INVENTION

Accordingly, the present invention has been made to solve the above-mentioned problems occurring in the prior art, and an object of the present invention is to provide a memory device capable of storing in a predetermined latch section, the data which are applied according to the write operation, then comparing the data stored in the latch section with the data compressed in a data compressor and detecting whether or not a failure occurs when executing write or read operations in the memory device, based on the compared results.

In order to accomplish this object, according to a first aspect of the present invention, there is provided a memory device capable of detecting its failure, the memory device includes a data input section for receiving data applied from an external part of the memory device; a latch section for receiving and storing therein the data which have passed through the data input section; memory cell arrays for storing therein the data which have passed through the data input section; and a data compressor for determining whether or not the data stored in the latch section and the data stored in the memory cell arrays are identical to each other.

Preferably, the memory device of the first aspect may further include a data output section for receiving output signals of the data compressor, and it is possible to determine whether or not the data stored in the latch section and the data stored in the memory cell arrays are identical to each other, based on logic signal values output from the data output section.

More preferably, in the memory device of the first aspect, the memory device may further include a data output section for receiving output signals of the data compressor, and an output terminal of the data output section is connected to data pads of the memory device.

Still more preferably, in the memory device of the first aspect, output data of the latch section are compressed data produced by compressing output data of the data input section, and output data of the memory cell arrays are uncompressed data.

Still more preferably, the data compressor includes a first comparator for determining whether or not logic values of the data stored in the memory cell arrays are all identical; a second comparator for determining whether or not the data stored in the memory cell arrays and the data stored in the latch section are all identical; and a third comparator for determining whether or not the determination result of the first comparator and the determination result of the second comparator are identical to each other.

According to second aspect of the present invention, there is provided a memory device capable of detecting its failure, the memory device includes a data input section for receiving data applied from an external part of the memory device, classifying the received data into N even data groups and N odd data groups and outputting the classified data groups, wherein the N is nature number; a latch section for storing first data of each of said N even data groups and said N odd data groups therein; memory cell arrays for storing the N even data groups and the N odd data groups therein; and a data compressor for determining whether or not first logic levels and second logic levels are identical, wherein the first logic levels are the logic levels of the first data of each data group stored in the latch section, and the second logic levels are the logic levels of both the N even data groups and the N odd data groups stored in the memory cell arrays corresponding to said data groups, respectively.

Preferably, in the memory device of the second aspect, the data compressor includes a first comparator for determining whether or not logic values of the data groups stored in the memory cell arrays are identical; a second comparator for determining whether or not third logic levels and fourth second ond logic levels are identical, wherein the third logic levels are the logic levels of the first data of each data group stored in the memory cell arrays, and the fourth logic levels are the logic levels of the first data of each data group stored in the latch section, wherein each data group stored in the latch section corresponds to said each data group stored in the memory cell arrays; and a third comparator for determining whether or not the determination result of the first comparator and the determination result of the second comparator are identical.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
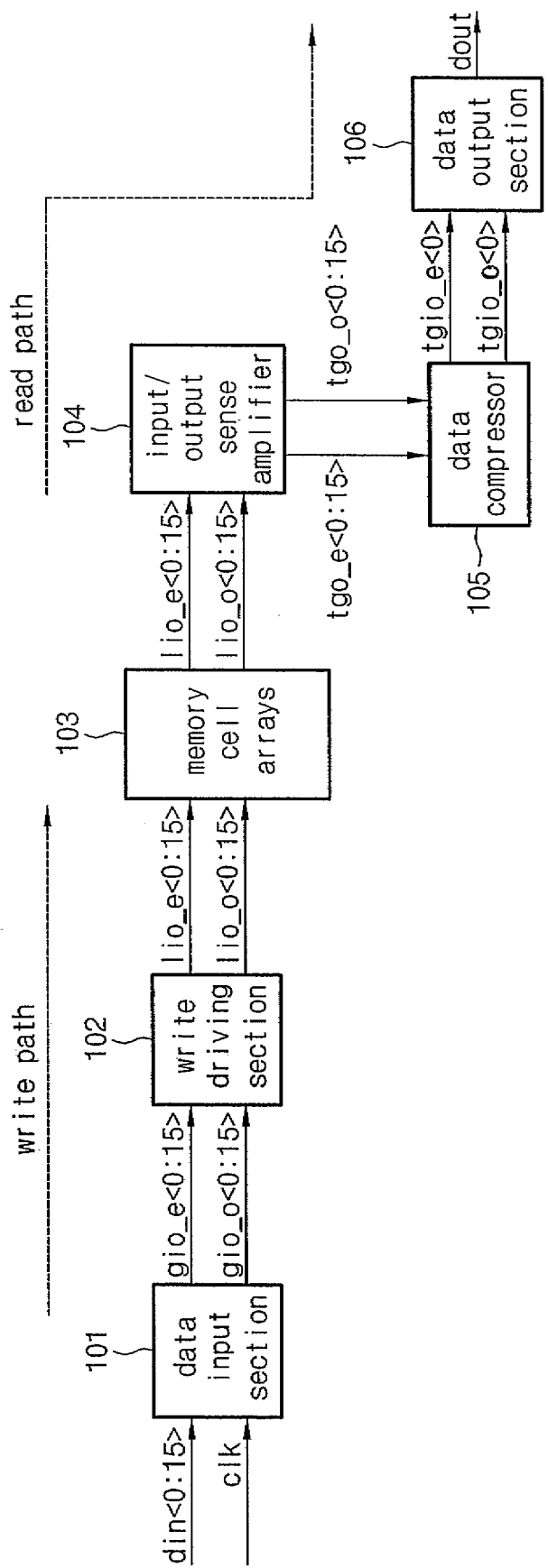
FIG. 1 illustrates a method for detecting whether or not a failure occurs in the memory device according to a prior art.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
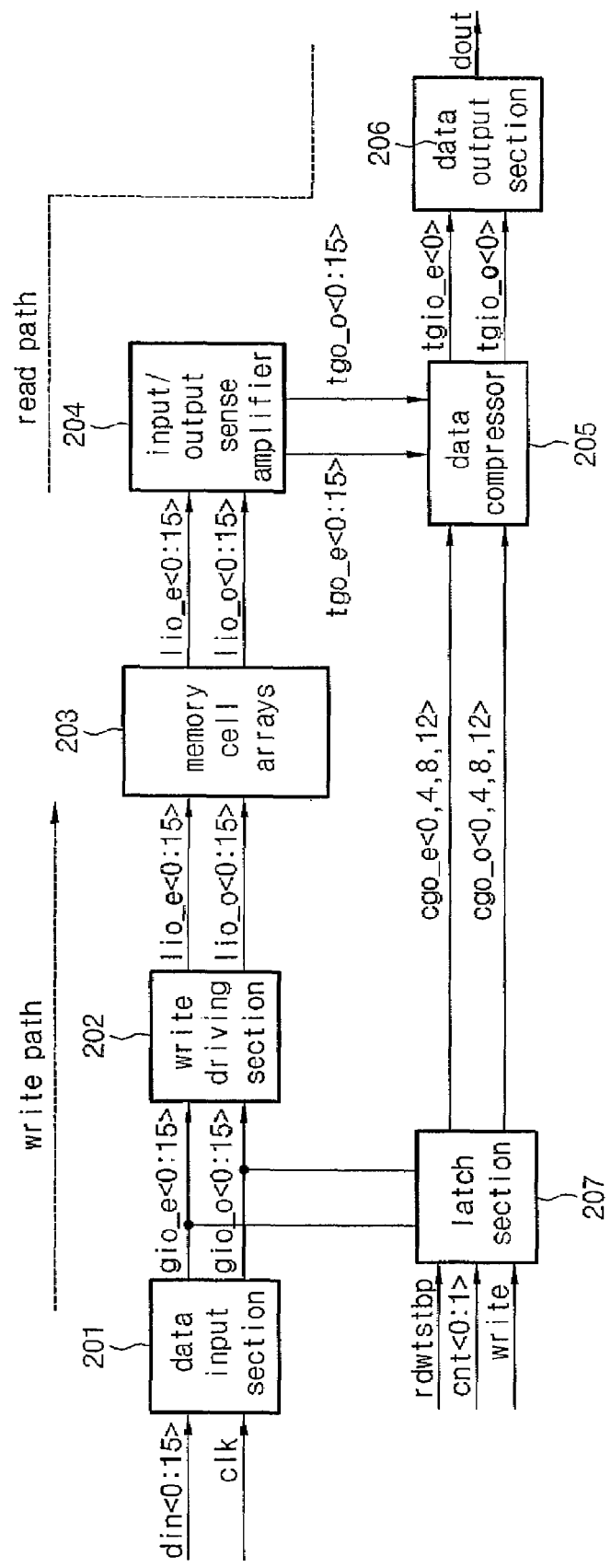
FIG. 2 illustrates a method for detecting whether or not a failure occurs in the memory device according to one embodiment of the present invention.

FIG. 2 illustrates a method for detecting whether or not a failure occurs in the memory device according to one embodiment of the present invention.

Referring to FIG. 2, if a write command becomes active, data Din<0:15> are applied to a data input section 201 in synchronizing with an external DLL clocks. The data Din<0:15> are applied for example, via 4 data pads. Data Din<0> are applied via a first data pad, data Din<1> are applied via a second data pad, data Din<2> are applied via a third data pad and data Din<3> are applied via a fourth data pad, respectively. Similarly, data Din<4:7> are applied via the first to fourth pads, respectively. Then, data Din<8:11> are also applied via the first to fourth data pads, and finally data Din<12:15> are applied via the first to fourth data pads, respectively. In this case, the data Din<0:3> are all at an identical logic level. Like this, data Din<4:7> are all at an identical logic level, data Din<8:11> are all at an identical logic level, and data Din<12:15> are all at an identical logic level, respectively.

According to one embodiment of the present invention, the memory device of FIG. 2 falls under the category of DDR SDRAM groups. Therefore, The data used in the memory device are applied thereto in synchronizing with rising edges and falling edges of the external DLL clock clk. Accordingly, it should be noted that the data Din<0:15> applied to the data input section 201 be formed by even data 16 bit and odd data 16 bit. For example, the data Din<1> are formed by the even data din_e<1> and odd data din_o<1>, and the data Din<4> are formed by the even data din_e<4> and the odd data din_o<4>.

The data input section 201 divides the input data Din<0:15> into the even data and the odd data. As shown in FIG. 2, the divided even and odd data gio_e<0:15> and gio_o<0:15> are applied to a write driving section 202 through the global input/output line.

The data applied to the write driving section 202 are applied to a memory cell arrays 203 through a local input/output line.

A latch section 207 receives even data gio_e<0,4,8,12> and odd data gio_o<0,4,8,12> among the data output from the data input section 201. Accordingly, the data stored in the latch section 207 have the same logic levels as those of the data applied to the data input section 201. In this case, the reason why only the even data gio_e<0,4,8,12> and the odd data gio_o<0,4,8,12> are latched is because it is more convenient to use, for comparison reference, only one of, for example, the even data gio_e<0> and the even data gio_e<1:3> which are identical in the logic levels thereof, and only one of the even data gio_e<4> and the even data gio_e<5:7> which are also identical in the logic levels thereof. In other words, because the logic levels of the even data gio_e<0> are the same as those of the even data gio_e<1:3>, and the logic levels of the even data gio_e<4> are the same as those of the even data gio_e<5:7>, it is not necessary to use all of the two kinds of even data having the same logic levels and it is more preferable or more convenient to use one of them for the comparison reference. Regarding the comparison processes, it will be described concretely along with an operation of the compressor 205 later.

From now on, a description will be provided with regard to an operation of the data compressor which compares the data read out from the memory cell arrays with the data stored in the latch section.

Figure 4:
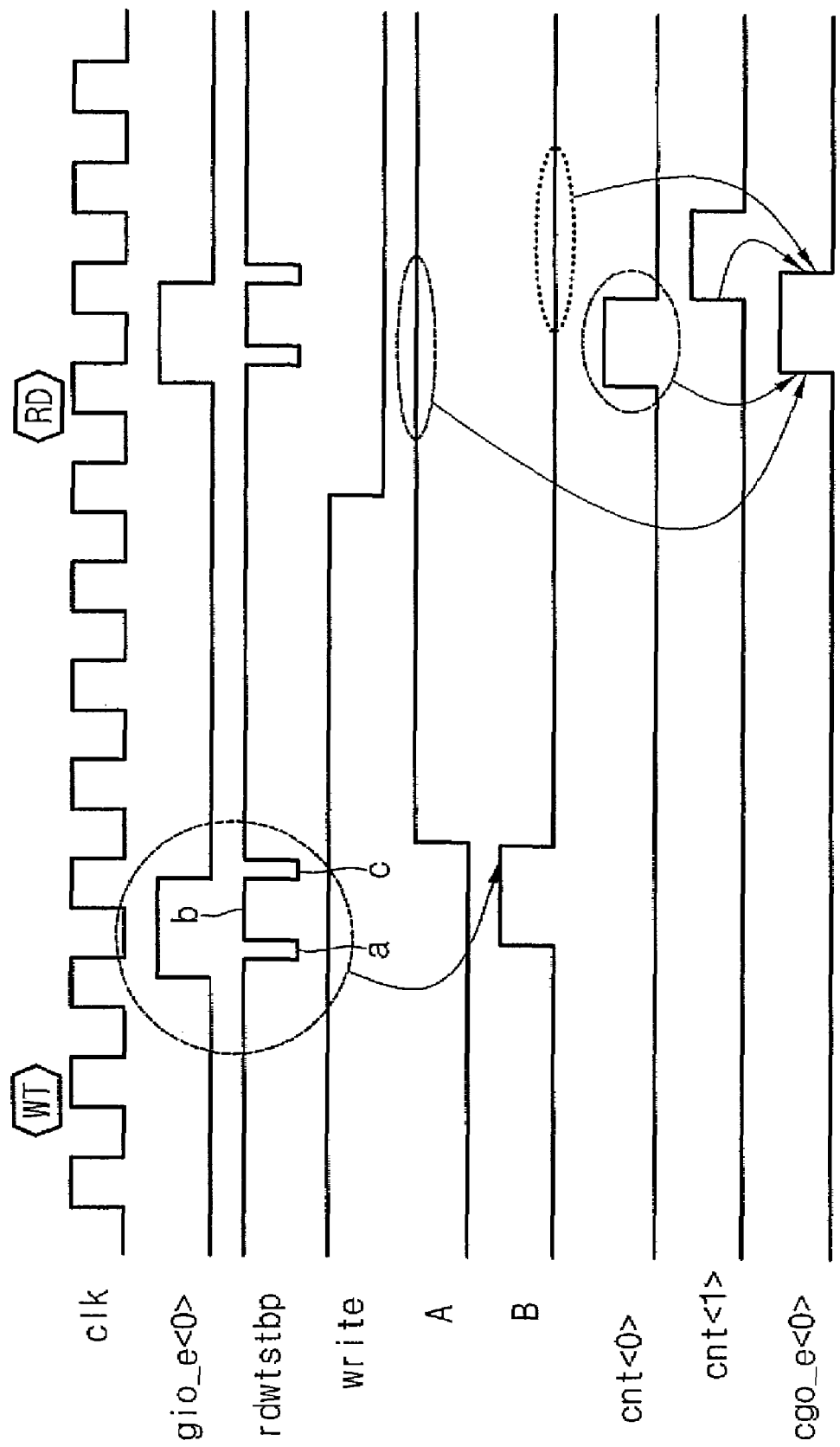
FIG. 4 is a waveforms diagram for illustrating circuits operation shown in FIG. 3.

The latch section 207 receives a signal rdwtstbp, cnt<0:1>, write. If the write signal write is enabled, the latch section 207 receives and latches the output signals gio_e<0,4,8,12>, gio_o<0,4,8,12> of the data input section 201. In this stage, the output signals of the data input section 201 are applied to the latch section 207 in synchronizing with read & write strobe pulse signals rdwtstbp as shown in FIG. 4. With a read command applied, the control signal cnt<0:1> causes the data stored in the latch section 207 to be sent to the data compressor 205.

Next time, if the read command becomes active, the data stored in the memory cell arrays 203 are sent to the input/output sense amplifier 204 via the local input/output line. Even data lio_e<0:15> and odd data lio_o<0:15> shown FIG. 2 indicate the data sent to the input/output sense amplifier 204 from the memory cell arrays 203.

The data tgo_e<0:15> and tgo_o<0:15> amplified in the input/output sense amplifier 204 are applied to the data compressor 205.

The data compressor 205 compares the data tgo_e<0:15> and tgo_o<0:15> of the input/output sense amplifier 204 with the data cgo_e<0,4,8,12> and cgo_o<0,4,8,12> of the latch section 207. Also, assuming that a first data is the data stored in the latch section during writing operation, and a second data is the data read out during reading operation, the data compressor 205 determines whether or not the first data and the second data are identical to each other.

The output signals tgio_e<0> and tgio_o<0> from the data compressor 205 are applied to the data output section 206. The data applied to the data output section 206 are output to an external part of the memory device in synchronizing with internal clocks generated in the DLL circuit (not shown). For example, the signal tgio_o<0> is output in synchronizing with rising edges of the internal clocks, and the signal tgio_e<0> is output in synchronizing with falling edges of the internal clocks.

Figure 3:
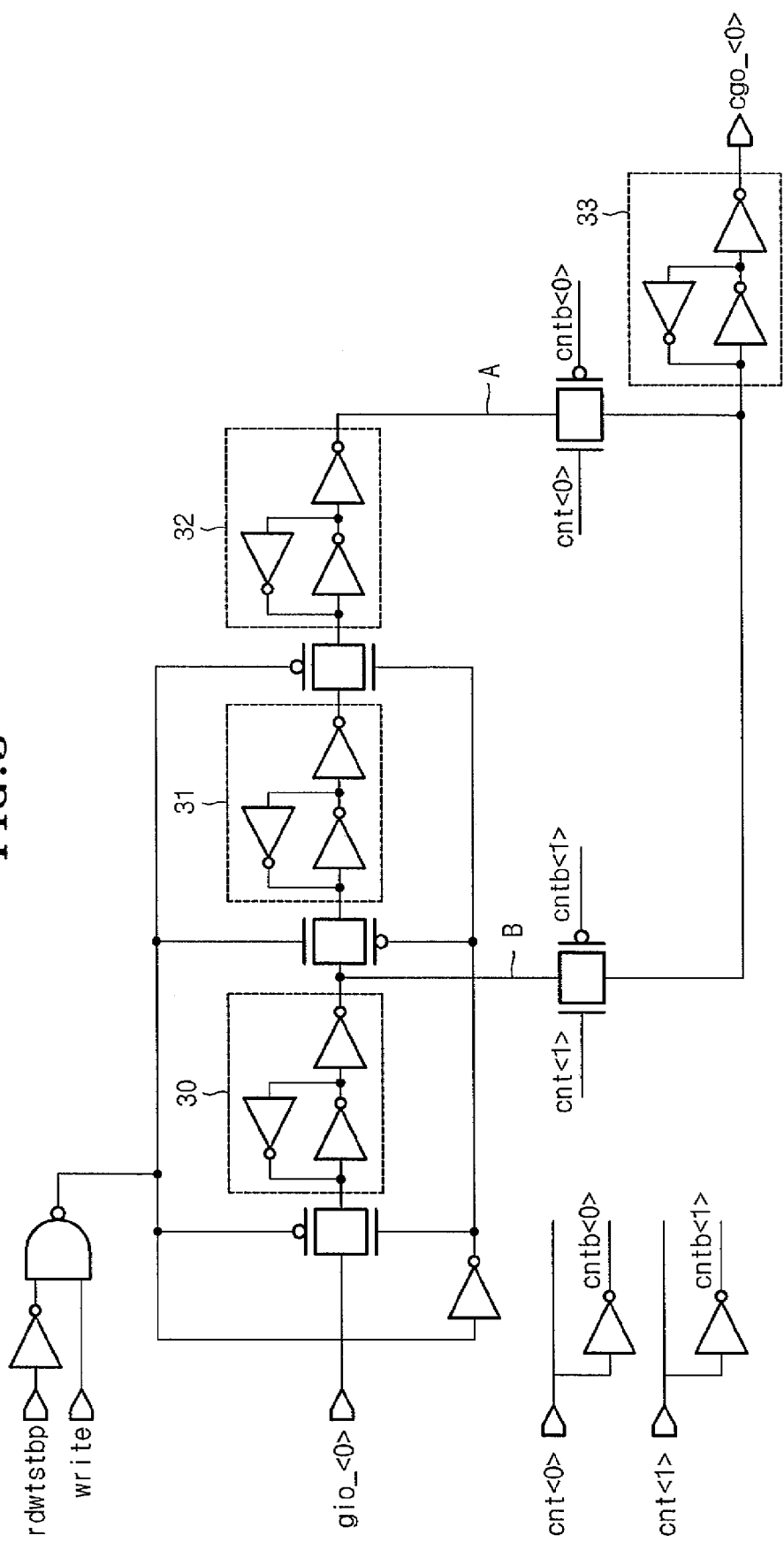
FIG. 3 illustrates a structure of a latch section shown in FIG. 2 according to one embodiment of the present invention.

FIG. 3 illustrates a structure of the latch section according to one embodiment of the present invention. The signals shown in FIG. 3 are the same as those of FIG. 2.

If a write command becomes active, the latch section of FIG. 3 receives and stores the data gio_e<0> in response to a write signal write and a read & write strobe pulse signal rdwtstbp. The latch section sends its stored data to the data compressor in response to a control signal cnt<0:1> which has been applied to the latch section after activation of a read command. Because the data gio_e<0,4,8,12> and gio_o<0,4,8,12> applied to the latch section 207 are all 8-bit data, the latch section 207 includes eight circuits, only one of which is shown in FIG. 3.

FIG. 4 is a waveform diagram for explaining the operation of the circuit shown in FIG. 3.

In several signals shown in FIG. 4, a WT indicates a write command, and an RD indicates a read command. The other signals of FIG. 4 are the same as those of FIG. 3. Signals A and B of FIG. 4 correspond to A and B of FIG. 3.

As shown in FIGS. 3 and 4, if the read & write strobe pulse signal rdwtstbp is changed to a low level (section a), the data gio_e<0> are stored in a data storage section 30. Accordingly, output of node B becomes a high level as shown in FIG. 4.

Next time, if the read & write strobe pulse signal rdwtstbp is changed to a high level (section b), the data stored in the data storage section 30 are transferred to a data storage section 31.

Next time, if the read & write strobe pulse signal rdwtstbp is changed to a low level (section c), the data stored in the data storage section 31 are transferred to a data storage section 32. Accordingly, a waveform of node A is as shown in FIG. 4.

Next time, if the control signal cnt<0> which have become active in response to a read command is changed to a high level, the data stored in the data storage section 32 are applied to a data section 33. Accordingly, the data cgo_<0> are transferred to the data compressor 205.

Next time, the data stored in the data storage section 30 are applied to a data storage section 33 in response to a control signal cnt<1> which have become active according to a read command like the control signal cnt<0>. Accordingly, a waveform of the data cgo_e<0> transferred to the data compressor 205 is as shown in FIG. 4.

Figure 5A:
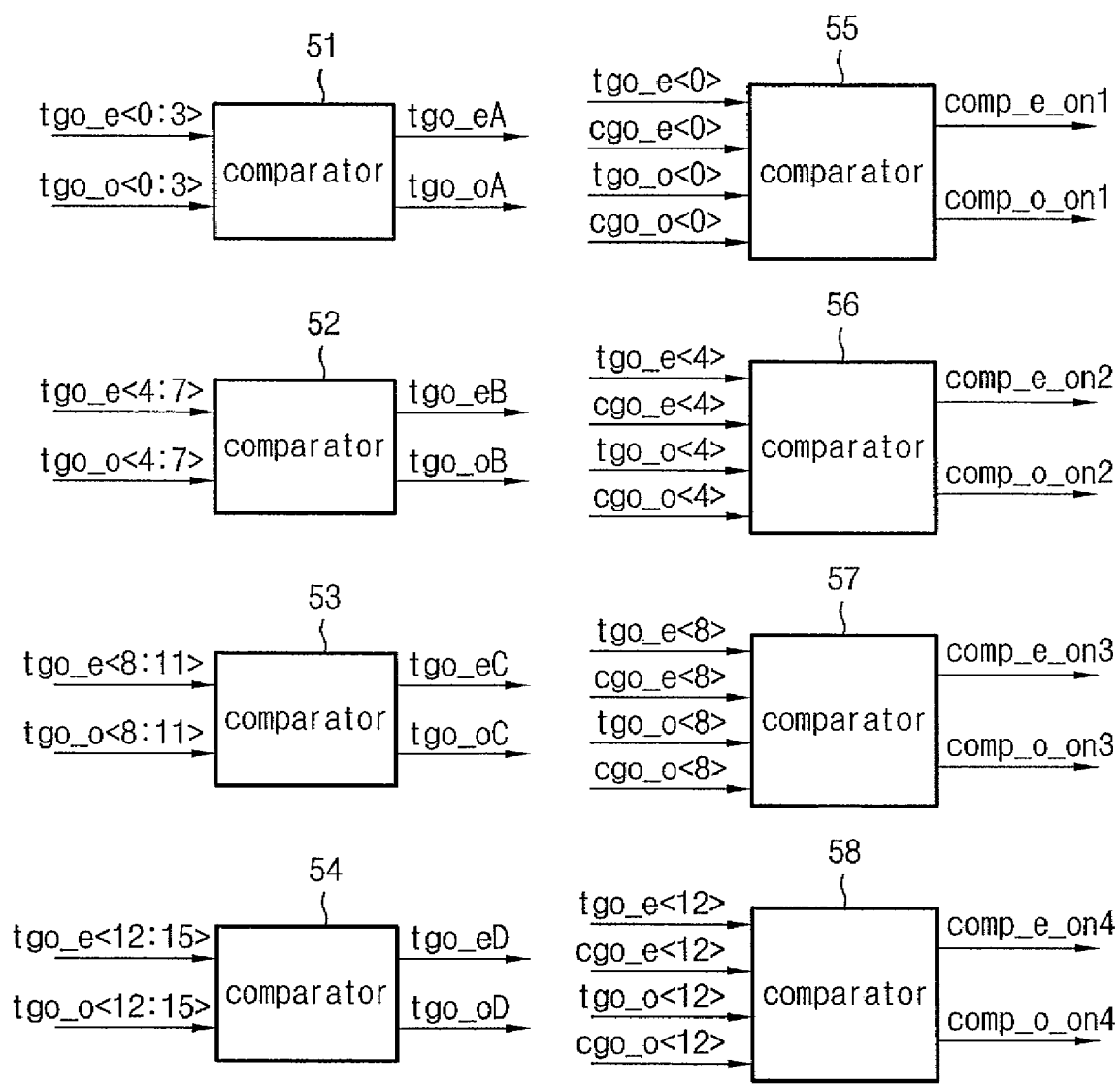
FIGS. 5a and 5b illustrate structures of data compressors according to one embodiment of the present invention.
Figure 5B:
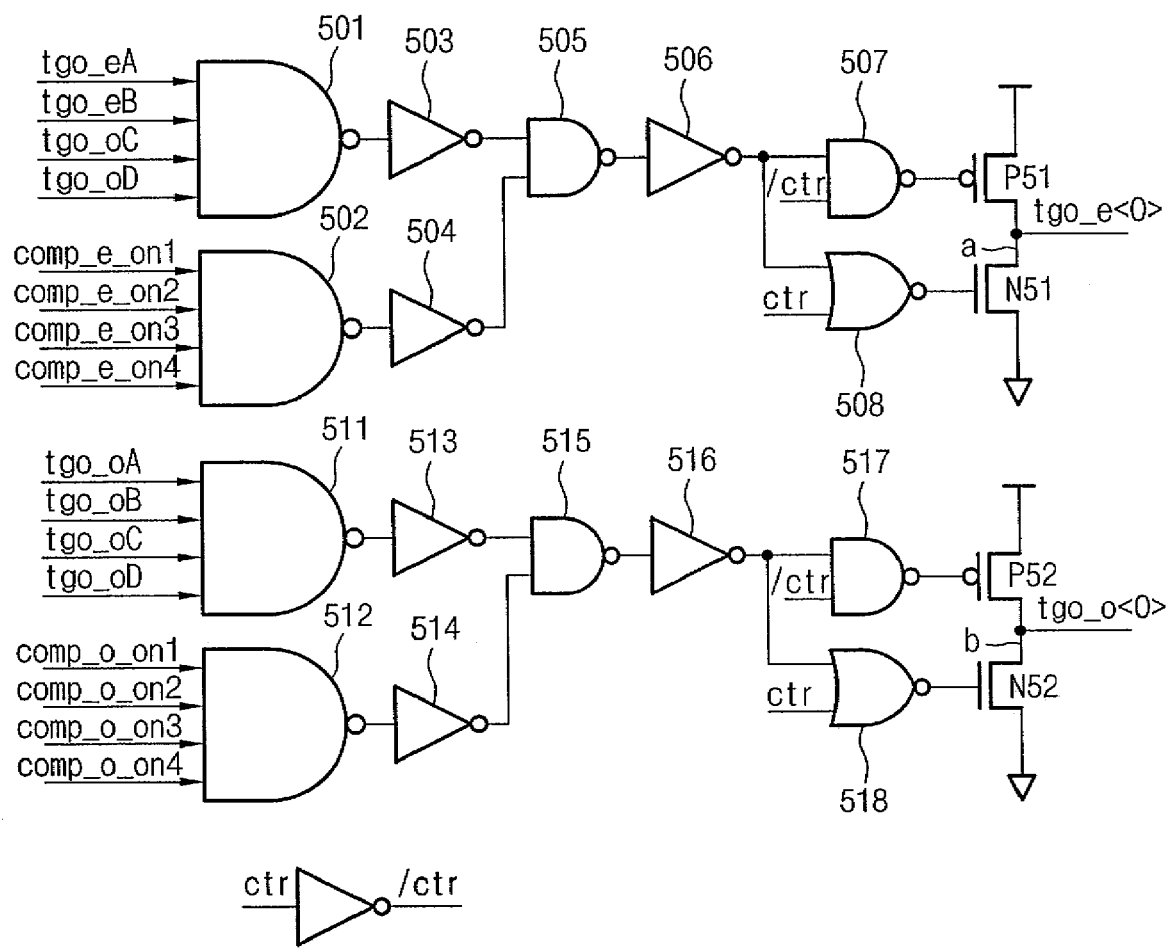

FIGS. 5a and 5b illustrate structures of the data compressors according to one embodiment of the present invention.

Figure 6:
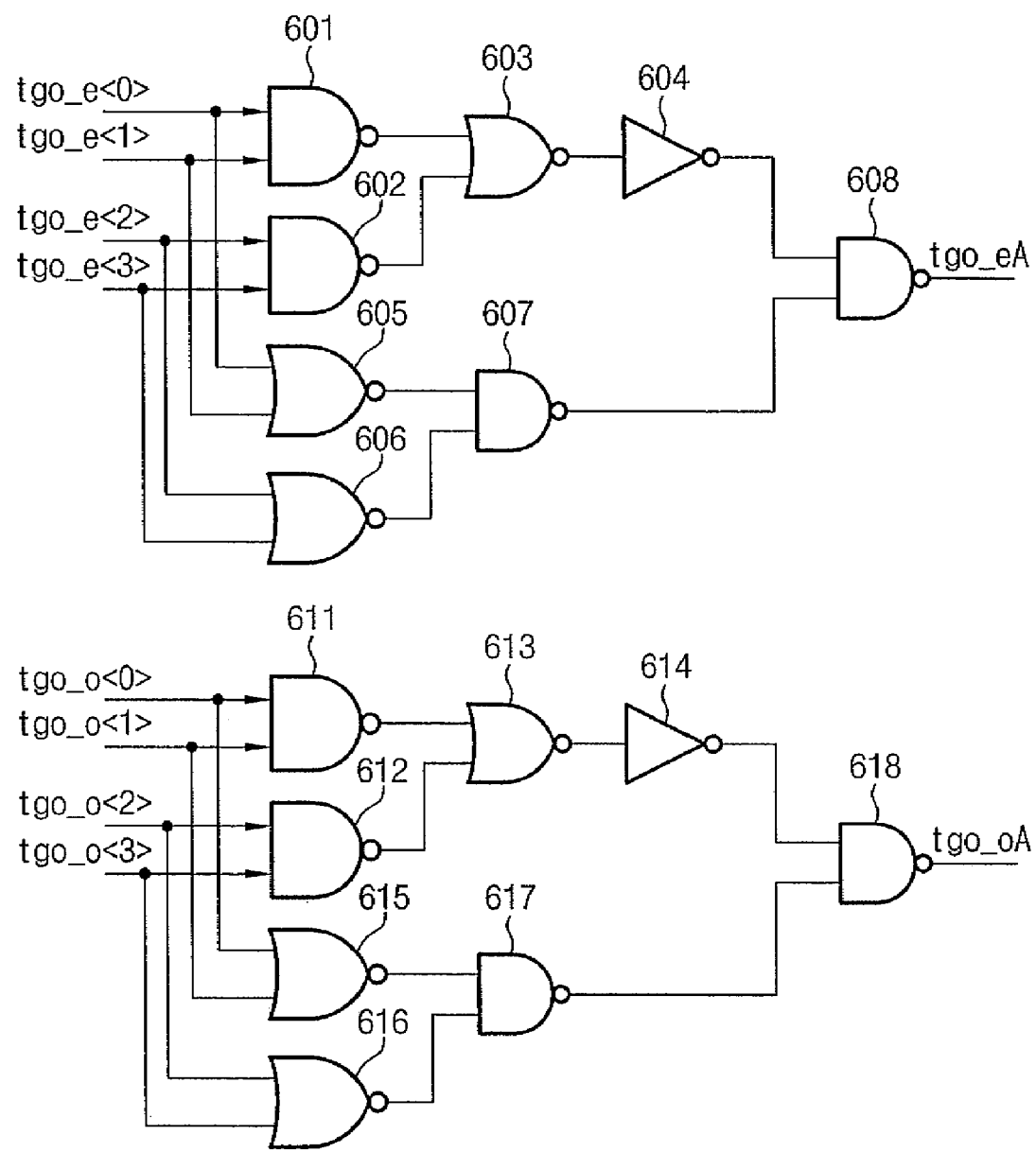
FIGS. 6 and 7 illustrate structures of comparators according to one embodiment of the present invention.

The comparators 51 to 54 of FIG. 5a determine whether or not all of the input data have an identical logic level. FIG. 6 shows a structure of the comparator 51 by way of an example in more detail according to one embodiment of the present invention. The other comparators 52 to 54 are the same as that of FIG. 6 in structures thereof. Therefore, for simplicity and convenience of description, the operation about only one comparator 51 will be described, referring to FIG. 6.

In FIG. 6, data tgo_e<0:3> and tgo_o<1:3> are output from the sense amplifier 204.

As shown in FIG. 6, a NAND gate 601 receives even data tgo_e<0:1>, a NAND gate 602 receives even data tgo_e<2:3>, a NOR gate 605 receives even data tgo_e<0:1> and a NOR gate 606 receives even data tgo_e<2:3>, respectively. Output signal of the NAND gate 601 and output signal of the NAND gate 602 are applied to a NOR gate 603. Output signals of the NOR gate 603 are applied to an inverter 604. Output signals of the NOR gate 605 and output signals of the NOR gate 606 are applied to a NAND gate 607, and output signals of the inverter 604 and output signals of the NAND gate 607 are applied to a NAND gate 608, respectively. An output signal of the NAND gate 608 corresponds to "tgo_eA".

A NAND gate 611 receives odd data tgo_o<0:1>, a NAND gate 612 receives odd data tgo_o<2:3>, a NOR gate 615 receives odd data tgo_o<0:1>, and a NOR gate 616 receives odd data tgo_o<2:3>, respectively. Output signals of the NAND gate 611 and output signals of the NAND gate 612 are applied to a NOR gate 613. Output signals of the NOR gate 613 are applied to an inverter 614. Output signals of the NOR gate 615 and output signals of the NOR gate 616 are applied to a NAND gate 617. Output signals of the inverter 614 and output signals of the NAND gate 617 are applied to a NAND gate 618. An output signal of the NAND gate 618 corresponds to "tgo_oA".

Hereinafter, the operation of the circuit shown in FIG. 6 will be described.

When the logic levels of the even data tgo_e<0:3> are identical, the output signal tgo_eA is at high level. Specifically, when the even data tgo_e<0:3> have all the high levels or all the low levels, the output signal tgo_eA of the NAND gate 608 is at high level. When at least one of the even data tgo_e<0:3>, however, has a different logic level from that of the others, the output signal tgo_eA of the NAND gate 608 is at low level, accordingly.

The characteristics of the odd data tgo_o<0:3> are in all respects the same as those of the even data in the operation of the circuit.

As shown in FIG. 2, the even data lio_e<0:3> stored in the memory cell arrays are of all the same logic level. Therefore, only when the data tgo_e<0:3> read out from the memory cell arrays 203 have all the same logic level, the output signal tgo_eA of the NAND gate 608 is at the high level. If there is a failure in at least one of the data stored in the memory cell arrays, the circuit of FIG. 6 can detect that failure. If there is the failure in the data, the output signal tgo_eA of the NAND gate 608 is at the low level. Also, the characteristics of the odd data tgo_o<0:3> are in all respects the same as those of the even data in the operation of the circuit.

Figure 7:
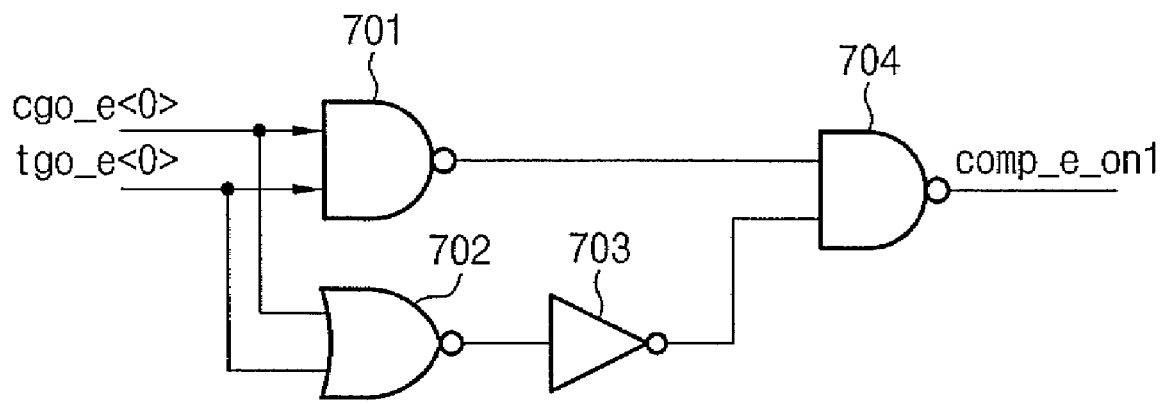
Figure 7:
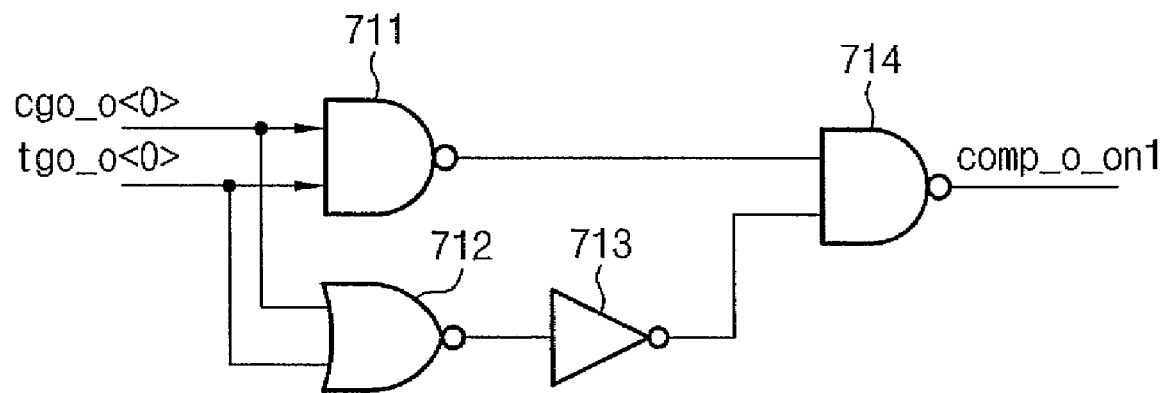

The comparators 55 to 58 of FIG. 5a determine whether or not the input data have all the same logic level. FIG. 7 shows a structure of the comparator 55 by way of an example in more detail according to one embodiment of the present invention. The other comparators 56 to 58 are the same as that of FIG. 7 in structures thereof. Therefore, for simplicity and convenience of description, the operation about only one comparator 55 will be described, referring to FIG. 7.

In FIG. 7, data cgo_e<0> and cgo_o<0> are output from the latch section 207, and data tgo_e<0> and tgo_o<0> are output from the comparator 51.

As shown in FIG. 7, a NAND gate 701 receives data cgo_e<0> and data tgo_e<0>, and a NOR gate 702 also receives the data cgo_e<0> and the data tgo_e<0>, respectively. Output signals of the NOR gate 702 are applied to an inverter 703. Output signals of the NAND gate 702 and output of the inverter 703 are applied to a NAND gate 704. Output signals of the NAND gate 704 are "comp_e_on1".

A NAND gate 711 receives data cgo_o<0> and data tgo_o<0>, and a NOR gate 712 also receives data cgo_o<0> and data tgo_o<0>, respectively. Output signals of the NOR gate 712 are applied to an inverter 713. Output signals of the NOR gate 712 and output signals of the inverter 713 are applied to a NAND gate 714. Output signal of the NAND gate 714 corresponds to "comp_o_on1".

Hereinafter, the operation of the circuit shown in FIG. 7 will be described.

When data cgo_e<0> and data tgo_e<0> are identical in logic levels thereof, the output signal of the NAND gate 704 is at high level. Also, when logic levels of data cgo_e<0> and data tgo_e<0> are different from each other, the output signal of the NAND gate 704 is at low level.

The data cgo_e<0> are stored at the time of the writing operation. Therefore, if the data cgo_e<0> have the same logic levels as those of the read and compressed data tgo_e<0>, there is not any failure. Whereas, if data cgo_e<0> do not have the same logic values (or levels) as those of the data tgo_e<0>, this means some failures have occurred.

Similar to the above case, if the data cgo_o<0> and the data tgo_o<0> have all the same logic levels, the output signal of the NAND gate 714 is at high level, whereas if the logic levels of the data cgo_o<0> are not the same as those of the data tgo_o<0>, the output signal of the NAND gate 714 are at low level.

Like this, the data cgo_o<0> are stored at the time of the writing operation. Therefore, if the data cgo_o<0> have the same logic levels as those of the read data tgo_o<0>, there is not any failure. Whereas, if data cgo_o<0> do not have the same logic values (or levels) as those of the data tgo_o<0>, this means some failures have occurred.

FIG. 5b illustrates the structure of a circuit for receiving the output signals of the comparators 51 to 58 and finally and synthetically determining whether or not the read data and the write data are identical based on the received data.

In FIG. 5b, a NAND gate 501 receives data tgo_eA, tgo_eB, tgo_eC, and tgo_eD among all the output signals of the comparators 51 to 54. A NAND gate 502 receives data comp_e_on<1:4> among all the output signals of the comparators 55 to 58. An inverter 503 receives output signals of the NAND gate 501, and an inverter 504 receives output signals of the NAND gate 502. A NAND gate 505 receives output signals of the inverter 503 and output signals of the inverter 504. An inverter 506 receives output signals of the NAND gate 505. A NAND gate 507 receives output signals of the inverter 506 and a control signal /ctr, and a NOR gate 508 receives output signals of the inverter 506 and a control signal ctr. Output signals of the NAND gate 507 are applied to a gate of a pull-up transistor P51, and output signals of the NOR gate 508 are applied to a gate of a pull-down transistor N51. The pull-up transistor P51 is connected between the power source voltage and the node a, and the pull-down transistor N51 is connected between the node a and the ground. The output signal of the node a corresponds to "tgio_e<0>".

A NAND gate 511 receives data tgo_oA, tgo_oB, tgo_oC, and tgo_oD among all the output signals of the comparators 51-54. A NAND gate 512 receives data comp_o_on_<1:4> among all the output signals of the comparators 55 to 58. An inverter 513 receives output signals of the NAND gate 511, and an inverter 514 receives output signals of the NAND gate 512. A NAND gate 515 receives output signals of the inverters 513 and 514. An inverter 516 receives output signals of the NAND gate 515. A NAND gate 517 receives output signals of the inverter 516 and a control signal /ctr, and a NOR gate 518 receives output signals of the inverter 516, a control signal ctr. Output signals of the NAND gate 517 are applied to a gate of a pull-up transistor P52, and output signals of the NOR gate 518 are applied to a gate of a pull-down transistor N52. The pull-up transistor P52 is connected between the power source voltage and the node b, and the pull-down transistor N52 is connected between the node b and the ground. The output signal of the node b is "tgio_o<0>".

Hereinafter, the operation of the circuit shown in FIG. 5b will be described.

When the signals applied to the NAND gates 501 and 502 are all at high levels, the pull-up transistor P51 is turned on. Accordingly, the output signal tgio_e<0> is at high level. In this case, there is no failure in the memory cell arrays.

However, when the signals applied to the NAND gate 501 are not identical in the logic values thereof, or when the signals applied to the NAND gate 502 are not identical in the logic values thereof, the pull-down transistor N51 is turned on. Accordingly, the output signal tgio_e<0> is at low level. In this case, there is at least one failure that has occurred in the memory cell arrays.

Similar to this, when the signals applied to the NAND gates 511 and 512 are all at high levels, the output signal tgio_o<0> is at high level, whereas when the signals applied to the NAND gates 511 and 512 are not identical to each other, the output signal tgio_o<0> is at low level.

As mentioned above, according to the present invention, the data compressor compares a first data with a second data and determines whether or not the first data and the second data are identical to each other, wherein the first data have been stored in the latch section at the time of the writing operation, and the second data have been output from the memory cell arrays at the time of the reading operation. According to a result of the above comparing and determining operations, if the first data stored in the latch section and the second data read out at the time of the reading operation are identical, the signals tgio_e<0> and tgio_o<0> are output at the high levels. On the contrary, the first data stored in the latch section at the time of the writing operation and the second data read out at the time of the reading operation are not identical, the signals tgio_e<0> and tgio_o<0> are output at the low levels.

According to the present invention, it is possible to determine whether or not there is any data failure in the memory cell arrays in aid of the data compressor capable of comparing the data in outside of the memory cell arrays.

As mentioned above, according to the present invention, it is possible to effectively determine whether or not any failure has occurred in the memory cell arrays.

Especially, even in case that all of the data groups written in the memory cell arrays have been changed in their logic levels, the present invention can has an advantage in that it is possible to surely determine whether or not any failure has occurred in the memory cell arrays.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A memory device capable of detecting its failure, the memory device comprising:
   a data input section for receiving data applied from an external part of the memory device;
   a latch section for receiving and storing therein the data which have passed through the data input section;
   memory cell arrays for storing therein the data which have passed through the data input section; and
   a data compressor for receiving the stored data from the memory cell array and the stored data from the latch section,
   wherein the data compressor determines whether or not the data stored in the latch section and the data stored in the memory cell arrays are identical to each other,
   wherein the latch section receives a write command signal and a read command signal, and receives and stores data output from the data input section in synchronization with the write command signal,
   wherein the data received and stored in the latch section remains in the latch section until the latch section receives a next write command signal,
   wherein the data stored in the latch section is sent to the data compressor in synchronization with the read command signal, and
   wherein the write command signal and the read command signal are activated at separate times.

2. The memory device capable of detecting its failure as claimed in claim 1, wherein the memory device further comprises a data output section for receiving output signals of the data compressor, and it is possible to determine whether or not the data stored in the latch section and the data stored in the memory cell arrays are identical to each other, based on logic signal values output from the data output section.

3. The memory device capable of detecting its failure as claimed in claim 1, wherein the memory device further comprises a data output section for receiving output signals of the data compressor, and an output terminal of the data output section is connected to data pads of the memory device.

4. The memory device capable of detecting its failure as claimed in claim 1, wherein the data compressor comprises:
   a first comparator for determining whether or not logic values of the data stored in the memory cell arrays are all identical;
   a second comparator for determining whether or not the data stored in the memory cell arrays and the data stored in the latch section are all identical; and
   a third comparator for determining whether or not the determination result of the first comparator and the determination result of the second comparator are identical to each other.

5. A memory device capable of detecting its failure, the memory device comprising:
   a data input section for receiving data applied from an external part of the memory device, classifying the received data into N even data groups and N odd data groups and outputting the classified data groups, wherein the N is natural number;
   a latch section for storing first data of each of said N even data groups and said N odd data groups therein;
   memory cell arrays for storing the N even data groups and the N odd data groups therein; and
   a data compressor for receiving the stored first data of each of said N even data groups from the latch section and said N odd data groups therein and the stored N even data groups and the N odd data groups therein from the memory cell arrays,
   wherein the data compressor determines whether or not first logic levels and second logic levels are identical, wherein the first logic levels are the logic levels of the first data of each data group stored in the latch section, and the second logic levels are the logic levels of both the N even data groups and the N odd data groups stored in the memory cell arrays corresponding to said data groups, respectively,
   wherein the latch section receives a write command signal and a read command signal, and receives and stores the first data output from the data input section in synchronization with the write command signal,
   wherein the first data received and stored in the latch section remains in the latch section until the latch section receives a next write command signal,
   wherein the first data stored in the latch section is sent to the data compressor in synchronization with the read command signal, and
   wherein the write command signal and the read command signal are activated at separate times.

6. The memory device capable of detecting its failure as claimed in claim 5, wherein the data compressor comprises:
   a first comparator for determining whether or not logic values of the data groups stored in the memory cell arrays are identical;
   a second comparator for determining whether or not third logic levels and fourth second logic levels are identical, wherein the third logic levels are the logic levels of the first data of each data group stored In the memory cell arrays, and the fourth logic levels are the logic levels of the first data of each data group stored in the latch section, wherein each data group stored in the latch section corresponds to said each data group stored in the memory cell arrays; and
   a third comparator for determining whether or not the determination result of the first comparator and the determination result of the second comparator are identical to each other.

7. A memory device capable of detecting its failure, the memory device comprising:
   a memory cell unit receiving and storing therein data applied from an external part of the memory device when a write command becomes active and outputting the data when a read command becomes active, wherein the data is classified into N groups each including a reference data, the N is a natural number;
   a latch section receiving and storing the reference data of the N groups when the write command becomes active and outputting the reference data stored therein when the read command becomes active;
   a data compressor receiving the data outputted from the memory cell unit and the reference data outputted form the latch section and determining whether or not the data outputted from the memory cell unit and the reference data outputted form the latch section are identical to each other,
   wherein the latch section receives a write command signal and a read command signal, and receives and stores data output from the data input section in synchronization with the activation of the write command, wherein the data received and stored in the latch section remains in the latch section until next a write command becomes active, wherein the data stored in the latch section is sent to the data compressor in synchronization with the activation of the read command, and wherein the write command signal and the read command signal are activated at separate times.

8. The memory device capable of detecting its failure as claimed in claim 7 wherein the memory device further comprises a data output section for receiving output signals of the data compressor, and it is possible to determine whether or not the data stored in the latch section and the data stored in the memory cell unit are identical to each other, based on logic signal values output from the data output section.

9. The memory device capable of detecting its failure as claimed in claim 7, wherein the data compressor comprises:
 a first comparator determining whether or not logic values of the data outputted from the memory cell unit are all identical;
 a second comparator determining whether or not the data outputted from the memory cell unit and the reference data outputted from the latch section are all identical; and
 a third comparator determining whether or not the determination result of the first comparator and the determination result of the second comparator are identical to each other.

* * * * *